United States Patent
Ben-Ayun et al.

(10) Patent No.: US 7,340,226 B2
(45) Date of Patent: Mar. 4, 2008

(54) CARTESIAN LOOP TRANSMITTER AND METHOD OF ADJUSTING AN OUTPUT LEVEL OF SUCH TRANSMITTER

(75) Inventors: Moshe Ben-Ayun, Tel Aviv (IL); Avi Ben-Salmon, Tel Aviv (IL); Mark Rozental, Tel Aviv (IL)

(73) Assignee: Motorola, Inc., Schaumburg, IL (US)

( * ) Notice: Subject to any disclaimer, the term of this patent is extended or adjusted under 35 U.S.C. 154(b) by 254 days.

(21) Appl. No.: 10/560,752

(22) PCT Filed: Apr. 30, 2004

(86) PCT No.: PCT/EP2004/050657

§ 371 (c)(1),
(2), (4) Date: Dec. 14, 2005

(87) PCT Pub. No.: WO2004/114518

PCT Pub. Date: Dec. 29, 2004

(65) Prior Publication Data

US 2007/0173213 A1    Jul. 26, 2007

(30) Foreign Application Priority Data

Jun. 17, 2003   (GB) ................................. 0313928.4

(51) Int. Cl.
*H01Q 11/12*   (2006.01)
(52) U.S. Cl. ...................................... 455/126; 330/109
(58) Field of Classification Search ................ 455/116, 455/126, 127.1, 127.2, 127.3; 330/107, 109, 330/149
See application file for complete search history.

(56) References Cited

U.S. PATENT DOCUMENTS

| | | | |
|---|---|---|---|
| 5,623,226 A * | 4/1997 | Whitmarsh et al. ............ 330/2 |
| 5,675,286 A | 10/1997 | Baker et al. | |
| 5,894,496 A * | 4/1999 | Jones ......................... 455/126 |
| 5,959,499 A | 9/1999 | Khan | |
| 2003/0031271 A1 | 2/2003 | Bozeki | |
| 2007/0184789 A1* | 8/2007 | Ben-Ayun et al. .......... 455/126 |

FOREIGN PATENT DOCUMENTS

| | | |
|---|---|---|
| EP | 1 235 344 A | 8/2002 |
| WO | WO 01/63792 A | 8/2001 |

* cited by examiner

*Primary Examiner*—Lee Nguyen
(74) *Attorney, Agent, or Firm*—Indira Saladi; Barbara R. Doutre

(57) ABSTRACT

In accordance with the present invention there is those provided a Cartesian loop transmitter having an isolator eliminator circuitry comprising a set of low pass and band pass filters for each of an I- and Q-channels, root mean square detectors and a divider connected to a comparator are received by a microprocessor which controls attenuation setting. There is also provided a method of adjusting an output level of such transmitter. Said method comprises the step of measuring an on-channel signal level and a noise level and then calculating a ratio of said noise to said on-channel signal. If the ratio exceeds a defined threshold an attenuation of the input attenuators is increased.

8 Claims, 3 Drawing Sheets

CARTESIAN LOOP TRANSMITTER AND METHOD OF ADJUSTING AN OUTPUT LEVEL OF SUCH TRANSMITTER

CROSS REFERENCE TO RELATED APPLICATIONS

This application claims the benefit of prior filed co-pending international application Serial No. PCT/EP2004/050657 filed on Apr. 30, 2004, and Great Britain application Serial No. 0313928.4 filed on Jun. 17, 2003. Both of these applications are assigned to Motorola, Inc.

FIELD OF THE INVENTION

The present invention relates to radio linear transmitters. More specifically, it relates a linear transmitter, whose stability of operation is maintained without an isolator and a method of adjusting an output level of such transmitter.

BACKGROUND OF THE INVENTION

Radio communication devices use antennas to provide for the efficient transmission of radio frequency (RF) communication signals. The transmitter portion of a communication device includes a power amplifier to amplify the radio frequency signals before they are coupled to the antenna for transmission. As modern radio communication systems work in narrow frequency bands the transmitters circuitries require RF power amplifiers able to operate in a linear fashion. Linear amplification is required to prevent distortion of the modulated signal and minimizing the interference. However non-linearity of real world RF amplifiers appears when they are operated at high drive levels. Similar situations may be caused by operating conditions. For example, a transmitter operating near an electromagnetically reflective structure may be susceptible to energy reflected back through the antenna into the transmitter.

There are known in the art transmitters with improved linearity. One method of linearization of transmitters is to use a Cartesian feedback loop based linearizer. The Cartesian feedback linearizer allows maintaining linearity of the transmitter while still allowing RF power amplifier to work close to its saturation point thus maintaining good efficiency. To protect against changes in load impedance as a result of reflected energy, an isolator or circulator is often inserted between the antenna and the power amplifier. The isolator protects the power amplifier by absorbing the reflected energy and preventing it from reaching the amplifier. The isolator directs the reflected energy to an absorptive load termination. Although the isolator generally works well, it adds significant cost, size, and weight to the design of a radio communication device. Isolators are narrowband, expensive and have large physical dimensions (especially at low frequencies).

There are also known in the art Cartesian loop transmitters without isolators. One such example is described in U.S. patent application No. US2003/0031271. In this document a method for isolator elimination is disclosed. In this prior art solution an isolator eliminator provides phase and level correction signals on the basis of samples of an information signal and a drive signal sampled from a feedback loop. These correction signals maintain stability the operation of the transmitter.

SUMMARY OF THE INVENTION

There is a need for an apparatus and a method for adjusting an output level of a Cartesian loop transmitter which alleviate or overcome the disadvantages of the prior art.

According to a first aspect of the present invention there is thus provided a Cartesian loop transmitter comprising a forward path and a feedback path (each of these paths comprising an I-channel and a Q-channel) as well as an isolator eliminator, said transmitter comprising:
 a first low pass filter and a first band pass filter connected to I-channel after loop poles and zeros and before up-converters (this point on the circuit will be further referenced as LP2);
 a second low pass filter and a second band pass filter connected to Q-channel at LP2;
 a first root mean square detector collecting signal from said first low pass filter and from said second low pass filter;
 a second root mean square detector collecting signal from said first band pass filter and from said second band pass filter;
 a divider connected to said first and said second root mean square detectors;
 a comparator connected to said divider; and to
 a microprocessor connected to an input attenuators and on said I- and Q-channels.

According to a second aspect of the present invention there is thus provided a method of adjusting an output level of a Cartesian loop transmitter in a digital radio system. The method comprising the steps of applying a factory predefined attenuation setting for adjusting said output level if attenuation setting for a previous slot is not available, or applying said attenuation setting obtained in previous slot for adjusting said output level in a current slot. Further steps are measuring an on-channel baseband signal level as well as a noise level at predefined frequency offset at LP2 and then calculating a ratio of said noise level to said on channel baseband signal level. If said ratio is above a threshold said attenuation setting of an input signal is increased. Finally, storing said attenuation setting in a memory.

Characteristics of a Radio Frequency Power Amplifier (e.g. Adjacent Channel Power (ACP), output power, etc.) change under influence Voltage Standing Wave Ratio (VSWR). The present invention beneficially allows adjusting a Cartesian loop output power by monitoring said Radio Frequency Power Amplifier (RFPA) nonlinearity.

Advantages of the present invention include:
 1) The method does not rely on specific RFPA behaviour versus (VSWR). An algorithm is monitoring non-linear products behaviour.
 2) The method does not require RFPA characteristic factory tuning.
 3) The method and the apparatus according to the present invention ensure extremely fast reaction to RFPA linearity change (less then 500 µsec).

BRIEF DESCRIPTION OF THE DRAWINGS

The present invention will be understood and appreciated more fully from the following detailed description taken in conjunction with the drawings in which.

DETAILED DESCRIPTION OF AN EMBODIMENT OF THE INVENTION

The term LP2 herein below refers to a point in the transmitter circuit located between loop poles and zeros and upmixer.

Figure 1:
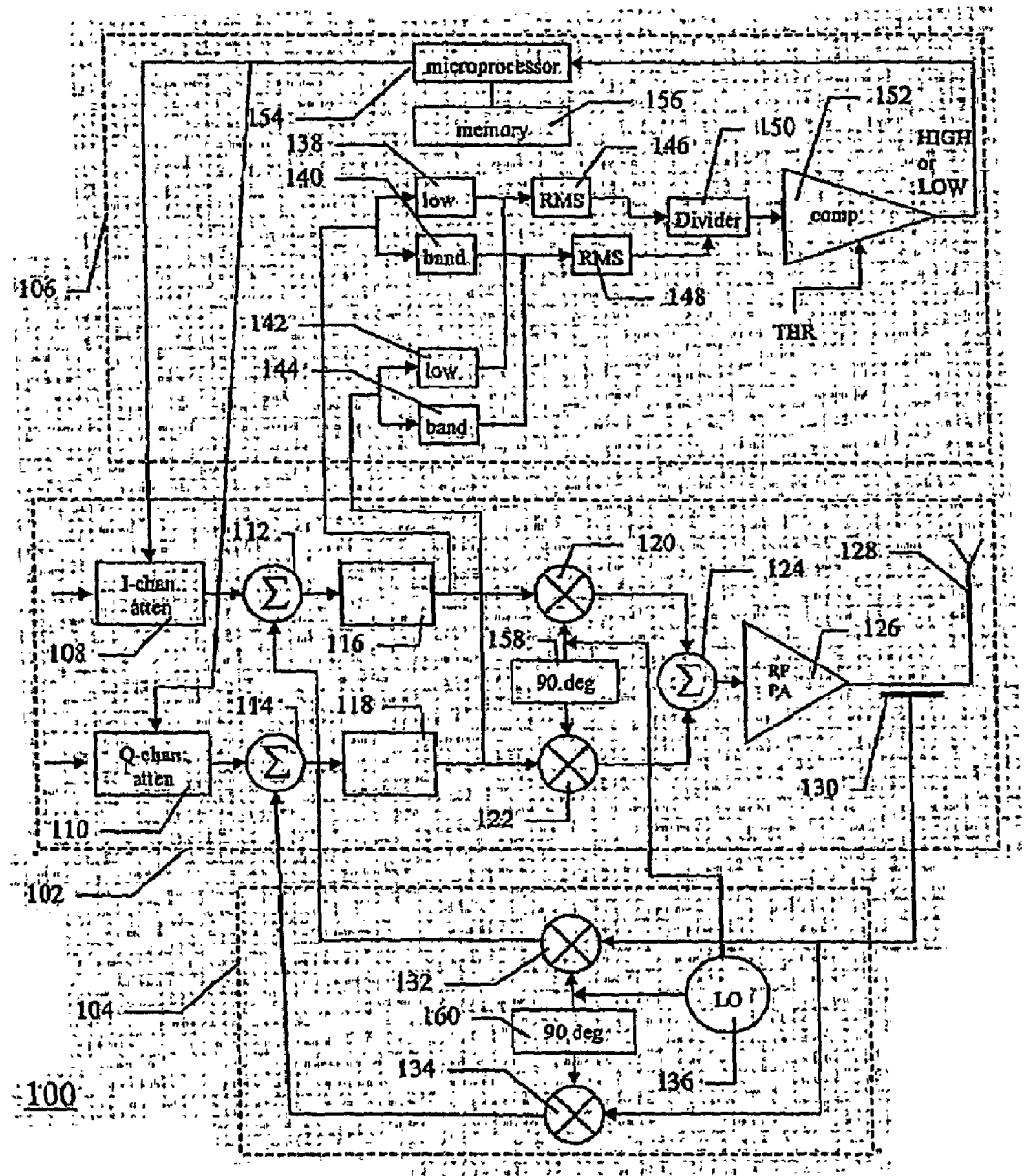
FIG. 1 is a schematic diagram illustrating a Cartesian loop transmitter in accordance with an embodiment of the present invention.

Referring to FIG. 1 a Cartesian loop transmitter circuit 100 according to one embodiment of the present invention is presented. Said Cartesian loop transmitter 100 incorporates a forward path 102, a feedback path 104 and an isolator eliminator 106. Said Cartesian loop transmitter 100 receives inputs at a baseband frequency in I- and Q-channels' attenuators, 108 and 110 respectively. Baseband signals from said attenuators 108 and 110 pass Cartesian loop summing junction 112 and 114 to amplifiers and loop filters 116 and 118. Said baseband signals are then upconverted to radio frequency (RF) signals by upconverters 120 and 122. Said RF signals are then combined at a RF summer 124 and amplified by a Radio Frequency Power Amplifier (RFPA) 126 and then transmitted over the air from an antenna 128.

Said feedback path 104 is supplied with a feedback signal from a directional coupler 130 which takes part of said RF signal from said forward path 102. Said feedback signal from said directional coupler 130 is downconverted to said baseband frequency by downconverters 132 and 134.

A local oscillator (LO) 136 generates a continuous wave RF carrier at the RF transmit frequency. A signal from said LO 136 is then applied to an I-channel up-converter 120 and an I-channel down-converter 132. Said LO 136 signal is also applied to a Q-channel up-converter 122 through a first 90 degree phase shifter 158 and to a Q-channel down-converter 134 through a second 90 degree phase shifter 160.

After applying mixing to baseband in said down-converters 132, 134 said feedback signal is passed to said first summing junctions 112 and 114 respectively.

Said isolator eliminator 106 monitors transmitted signals at LP2, i.e. after amplifiers and loop filters 116 and 118 and before upconverters 120 and 122. Said loop filters of 116 and 118 are baseband low pass filters that consist of poles and zeros.

Figure 2:
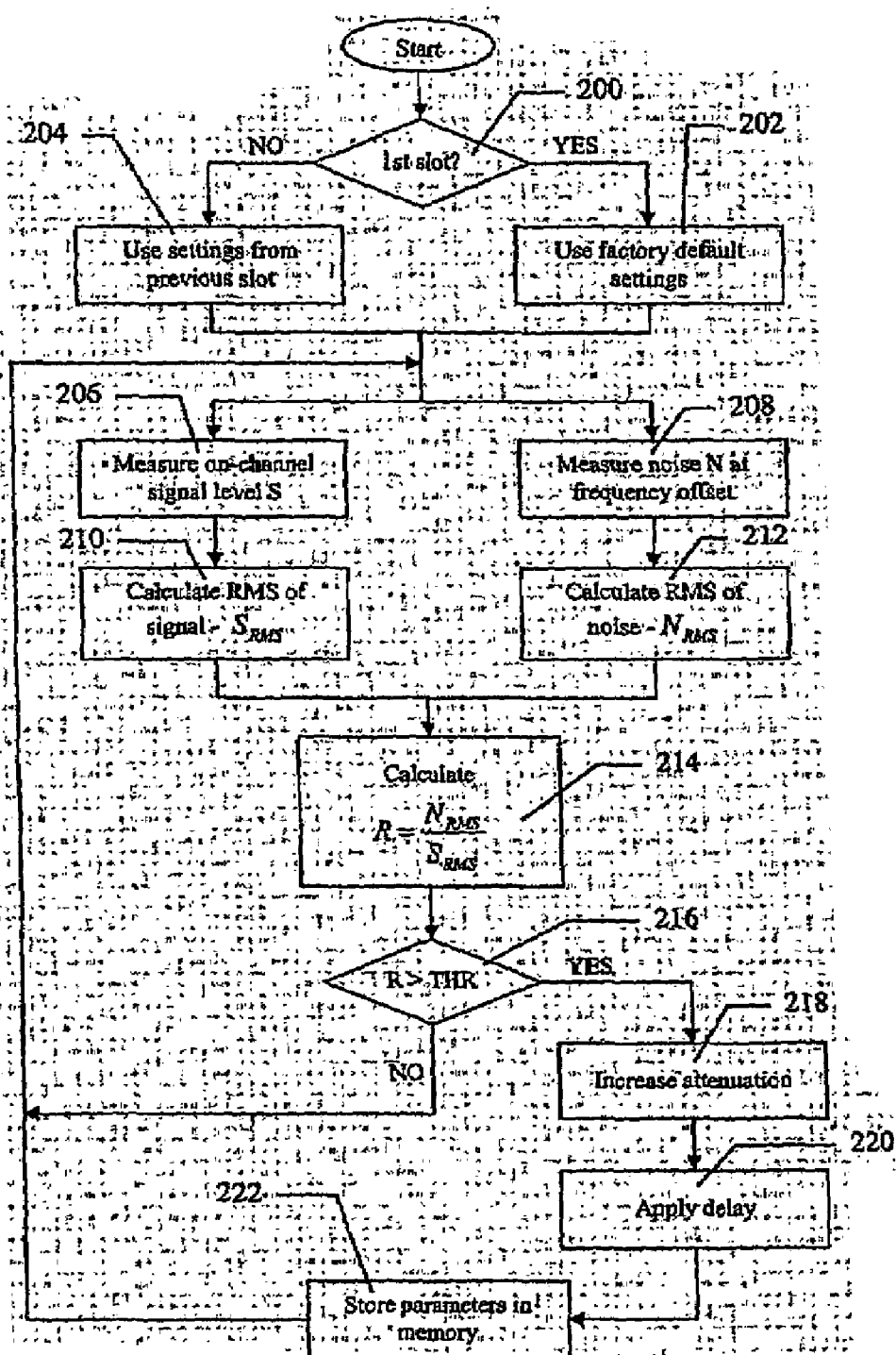
FIG. 2 is a flow chart illustrating a method of adjusting an output level of a Cartesian loop transmitter in accordance with an embodiment of the present invention.

With reference to FIGS. 1 and 2 said isolator eliminator 106 continuously collects an on-channel baseband signal level as well as a noise level at a predefined frequency offset in relation to a transmission channel, 206 and 208, from both said I- and Q-channels.

In one embodiment the frequency offset can be +13.5 kHz (or −13.5 kHz). This is done by passing the I-channel LP2 signal through a centered, narrow, 2 kHz, first band pass filter 140 at +13.5 kHz (or −13.5 kHz) offset, whereas Q-channel LP2 signal is passed through a second band pass filter 144.

Said baseband signals from said I- and Q-channels are filtered by a first and a second 8 kHz low pass filters 138 and 142 respectively.

Then outputs from said band pass filters 140 and 144 and said low pass filters 138 and 142 are passed through root mean square (RMS) detectors 146 and 148 to a divider 150. In said divider 150 a ratio of said RMS of said noise level to said RMS of said on-channel baseband signal level is calculated 214. Result of said calculation is passed to a comparator 152. Said comparator 152 sends signal HIGH if said ratio exceeds a redefined threshold THR or LOW if said ratio is equal or below said predefined threshold THR.

Said signal from said comparator 152 is received by a microprocessor 154, which controls said input attenuators 108 and 110 of said I- and Q-channels. If said signal from said comparator 152 is HIGH said microprocessor 154 sends command to said input attenuatotrs 108 and 110 to increase attenuation 218 setting by a predefined constant value.

Said microprocessor 154 applies then a delay 220 to execution of software, which based on next samples, calculates said ratio and increases said attenuation setting. Said delay is implemented by not reading results of said comparator 152 for defined period of time. Said delay is applied to ensure that after increasing said attenuation setting the output of other elements of the circuit, i.e. said filters 138, 140, 142 and 144 will be stable (filter step response transient effect will be over).

Said microprocessor 154 stores 222 said attenuation setting of said input attenuators 108 and 110 in a memory 156.

FIG. 2 shows a flow chart illustrating a method of adjusting an output level of a Cartesian loop transmitter 100 in a digital radio system according to one embodiment of the present invention.

In the first step 200 it is checked whether said attenuation setting from previous slot are stored in said memory 156. If said data are available said Cartesian loop transmitter 100 is adjusted according to these setting 204. If this is a first slot in transmission and there are no said attenuation setting stored in said memory 156 a factory default setting are used 202 for adjusting said transmitter 100. When the transmitter 100 starts transmission said on-channel baseband signal level 206 and said noise level at predefined frequency offset 208 are measured at LP2. Root mean square values of said noise level 212 and said on-channel baseband signal level 210 are taken for calculation of a ratio of said noise level to said on-channel baseband signal level 214. Said noise is also measured at LP2 and is mainly due to the RFPA non-linear intermodulation products.

If said ratio is equal or below 216 a predefined threshold then measurement of said on-channel baseband signal level 206 and said noise level 208 are perfomed.

If said ratio exceeds said threshold 216, said attenuation setting of said input attenuators 108 and 110 are increased 218 by a constant value. Additionally a delay is applied 220 to execution of software, which based on next samples, calculates said ratio and increases said attenuation setting.

As during one time slot a plurality of samples are taken, the steps starting from measurement of said noise level and said on-channel baseband signal level 206 and 208 through step of storing 222 said attenuation setting are performed in a loop.

Additionally in the step 222 of storing said attenuation parameters said baseband signal level and said noise level measured at LP2 are also stored in said memory 156.

Below is a short explanation of theoretical background of the method of adjusting the output level of Cartesian loop transmitter according to an embodiment of the present invention.

Figure 3:
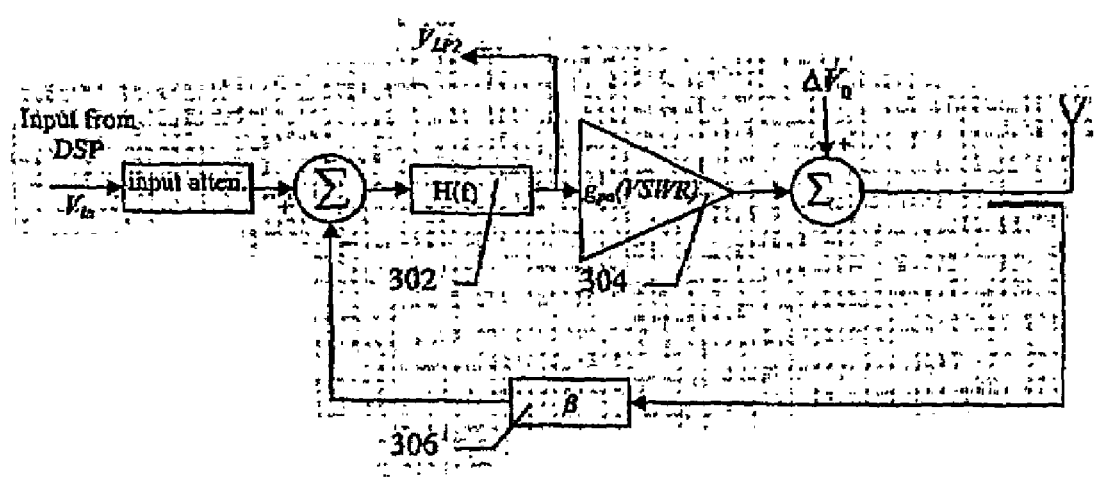
FIG. 3 is a simplified diagram of a known in the art Cartesian feedback loop transmitter.

Referring to FIG. 3 which is a simplified diagram of a known Cartesian loop transmitter 300 it can be found that the transfer function from $\Delta V_0$ to LP2 ($\Delta V_0$ represents RFPA 304 non-linear intermodulation products) can be written as follow:

$$\frac{V_{LP2}}{\Delta V_o} = \frac{-\beta \cdot H(f)}{1 + H(f) \cdot g_{pa}(VSWR) \cdot \beta} \qquad \text{(Eq. 1)}$$

For $H(f) \cdot g_{pa}(VSWR) \cdot \beta \gg 1$ it can be approximated $$\frac{V_{LP2}}{\Delta V_o} \approx \frac{-1}{g_{pa}(VSWR)} \qquad \text{(Eq. 2)}$$

Where
$\Delta V_o$ represents RFPA 304 non-linear intermodulation products,
$g_{pa}(VSWR)$ is RFPA 304 gain,
$H(f)$ is a loop filter 302 transfer function,
$V_{in}$ is an input voltage to the loop,
$V_{LP2}$ is a voltage after the loop filter 302,
$\beta$ is a feedback loop 306 gain.

From Eq. 12 it can be found that those non-linearities at LP2 will be dominated by RFPA 304 non-linearities. This means that Adjacent Channel Power (ACP) of RFPA 304 can be monitored by looking at LP2 ACP.

In one embodiment, the isolator eliminator 106 is implemented in software executable on a Digital Signal Processor (DSP). A software implementation is relatively low cost and allows easy reconfiguration. However hardware implementation is also possible. Nevertheless, it will be appreciated that the present invention may be implemented hardware or software and may be used in radio communication devices.

The invention claimed is:

1. A Cartesian loop transmitter comprising a forward path and a feedback path, each of these paths comprising an I-channel and a Q-channel, as well as an isolator eliminator and wherein said transmitter comprises:
   a) a first low pass filter and a first band pass filter connected to the I-channel at a first upconverter;
   b) a second low pass filter and a second band pass filter connected to the Q-channel at a second upconverter;
   c) a first root mean square detector collecting signal from said first low pass filter and from said second low pass filter;
   d) a second root mean square detector collecting signal from said first band pass filter and from said second band pass filter;
   e) a divider connected to said first and said second root mean square detectors;
   f) a comparator connected to said divider; and to
   g) a microprocessor connected to input attenuators on said I- and Q-channels.

2. The Cartesian loop transmitter (100) of claim 1 wherein a memory is connected to said microprocessor.

3. The Cartesian loop transmitter of claim 1 wherein the transmitter is operable to provide communications in at least one of TETRA, GSM, and IDEN communication systems.

4. A method of adjusting an output level of a Cartesian loop transmitter in a digital radio system, the method comprising the steps of:
   a) applying a factory predefined attenuation setting for adjusting said output level if attenuation setting for a previous slot is not available, or applying said attenuation setting obtained in the previous slot for adjusting said output level in a current slot;
   b) measuring an on-channel baseband signal level;
   c) measuring a noise level at predefined frequency offset;
   d) calculating a ratio of said noise level to said on-channel baseband signal level; and
   e) if said ratio is above a threshold, increasing an attenuation setting of an input signal and storing said attenuation setting in a memory.

5. The method according to claim 4 wherein steps b) through e) are repeated in a loop until said ratio is below said threshold.

6. The method according to claim 4 wherein calculating said ratio comprises taking a root mean square of said on-channel baseband signal level and a root mean square of said noise level.

7. The method according to claim 4 wherein after increasing said attenuation setting a delay is applied to execution of software, which based on next samples, calculates said ratio and increases said attenuation setting.

8. The method according to claim 4 wherein in said step of storing said baseband signal level and said noise level measured are stored in said memory.

* * * * *